US011289437B1

(12) United States Patent
Ota et al.

(10) Patent No.: US 11,289,437 B1
(45) Date of Patent: Mar. 29, 2022

(54) SEMICONDUCTOR DEVICE

(71) Applicant: RENESAS ELECTRONICS CORPORATION, Tokyo (JP)

(72) Inventors: Tomoaki Ota, Tokyo (JP); Makoto Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/082,766

(22) Filed: Oct. 28, 2020

(51) Int. Cl.
*H01L 23/00* (2006.01)

(52) U.S. Cl.
CPC ............. *H01L 24/06* (2013.01); *H01L 24/46* (2013.01); *H01L 2224/04042* (2013.01)

(58) Field of Classification Search
CPC H01L 24/06; H01L 2224/04042; H01L 24/46
USPC ........................................................ 257/734
See application file for complete search history.

(56) References Cited

U.S. PATENT DOCUMENTS

| 2005/0253236 | A1* | 11/2005 | Nakayama | ......... | H01L 25/0657 |
| | | | | | 257/678 |
| 2007/0181908 | A1* | 8/2007 | Otremba | ................ | H01L 24/49 |
| | | | | | 257/107 |
| 2009/0294977 | A1* | 12/2009 | Jao | ....................... | H01L 23/5286 |
| | | | | | 257/773 |
| 2010/0148244 | A1* | 6/2010 | Kitabatake | .............. | H01L 24/06 |
| | | | | | 257/328 |
| 2014/0103542 | A1* | 4/2014 | Katagiri | ................ | H01L 23/498 |
| | | | | | 257/777 |
| 2016/0093557 | A1* | 3/2016 | Nishikizawa | ..... | H01L 23/49575 |
| | | | | | 257/676 |
| 2016/0099203 | A1* | 4/2016 | Kim | .................... | H01L 25/0652 |
| | | | | | 257/773 |

FOREIGN PATENT DOCUMENTS

JP        2008-017620 A        1/2008

* cited by examiner

*Primary Examiner* — Didarul A Mazumder
(74) *Attorney, Agent, or Firm* — McDermott Will & Emery LLP

(57) ABSTRACT

A semiconductor device includes a power MOS chip having a source electrode on a surface and a control chip mounted on a portion of the power MOS chip, wherein, viewing from a first outer edge of the power MOS chip extending in a first direction to the control chip, a first column bonding pad and a second column bonding pad are formed in a region of the source electrode where the control chip is not mounted, and wherein a distance between a second outer edge of the power MOS chip extending in a second direction and the first column bonding pad is longer than a distance between the second outer edge and the second column bonding pad.

9 Claims, 9 Drawing Sheets

SEMICONDUCTOR DEVICE

BACKGROUND

The present invention relates to semiconductor device, particularly semiconductor device having a power semiconductor device.

In order to drive a load such as a motor, a heater, a lamp mounted on a vehicle and to perform voltage conversion, a power semiconductor element is used. As the power semiconductor device, a power MOSFET or an IGBT (Insulated Gate Bipolar Transistor) is used.

In-vehicle semiconductor device, from the viewpoint of functional safety, it is desirable to equip a failure detecting function and a protective function. Therefore, a function for detecting abnormal conditions such as overcurrent or overheating of the power MOSFET and protecting the power MOSFET and a function for outputting self-diagnosis data to monitor the output status of the power MOSFET are installed in semiconductor device using the power MOSFET (or IGBT).

A semiconductor chip (also called as a power MOS chip) mounting a power MOSFET, and a semiconductor chip (also called as a control chip) controlling the power MOS chip and mounting the protective function and the self-diagnosis output function are composed of separated semiconductor chips. Recently, for miniaturization and cost reduction of products, a product called IPD (Intelligent Power Device) in which the power MOS chip and the control chip are mounted in one package is used.

Patent Document 1, a technique for mounting a plurality of power MOS chips and a semiconductor chip including a drive circuit and a control circuit of the power MOSFET in one package is disclosed.

PRIOR-ART DOCUMENT

[Patent Document]

[Patent Document 1] Japanese Unexamined Patent Application Publication No. 2008-17620

SUMMARY

In Patent Document 1, a plurality of chips is arranged on a plane, but there is also a stack structure IPD in which the control chip is mounted on the power MOS chip. FIGS. 7 to 9 are used to explain. FIG. 7 shows plan view of a vertical power MOS chip. In the case of the vertical power MOS chip, most of the chip surface is covered a source electrode 1. Further, a drain electrode is provided on the back surface of the power MOS chip. FIG. 8 is a plan view of IPD in which control chip 2 is mounted on top of power MOS chip 3 (an encapsulant is transparent). FIG. 9 is a cross-sectional view along A-A' of FIG. 8. A source pad 4 is provided on the source electrode of the power MOS chip 3, a lead 5 (source terminal) of the package and the source pad 4 are connected by a bonding wire 6. The drain electrode of the power MOS chip 3 is connected to a drain terminal of the package. When mounting the control chip 2 on the power MOS chip 3, a region for providing the source pad 4 is limited. This is because the source pad 4 must be provided in a region where the control chip 2 is not disposed in the source electrode of the power MOS chip 3. In this case, a problem that a current flowing is varied depending on a location in the power MOS chip 3 is occurred. This is because more current flows through a transistor formed near the source pad 4, and less current flows through a transistor formed at a position away from the source pad 4.

Variation of the current results in breakdown of the power MOS chip and degradation of the performance. The place where more current flows is likely to occur breakdown, the place where less current flows is hard to contribute to the reduction of the on-resistance.

Other objects and novel features will become apparent from the description of the specification and drawings.

A semiconductor device according to an embodiment includes a power MOS chip having a source electrode on a surface and a control chip mounted on a portion of the power MOS chip, wherein, viewing from a first outer edge of the power MOS chip extending in a first direction to the control chip, a first column bonding pad and a second column bonding pad are formed in a region of the source electrode where the control chip is not mounted, and wherein a distance between a second outer edge of the power MOS chip extending in a second direction and the first column bonding pad is longer than a distance between the second outer edge and the second column bonding pad.

Semiconductor device according to an embodiment, it is possible to reduce the variation of the current flowing through the power MOSFET.

FI G. 7 shows plan view of the power MOS chip.

Figure 8:
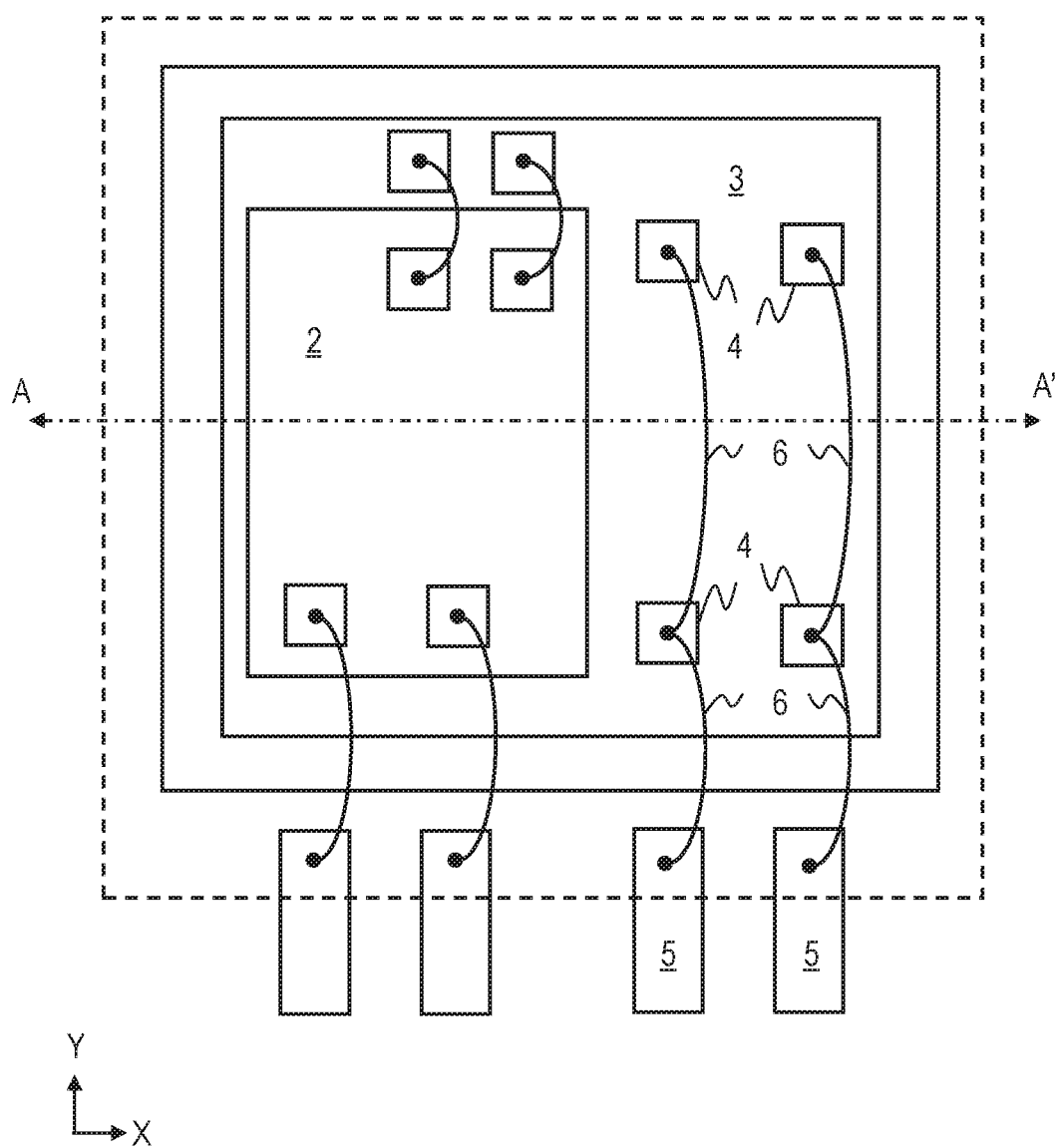

FIG. 8 shows plan view of the conventional semiconductor device.

Figure 9:
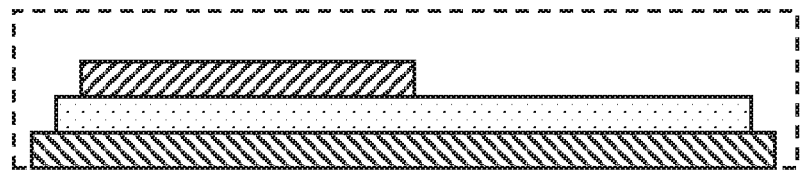
Figure 9:
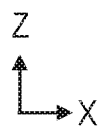

FIG. 9 shows cross-sectional view of the conventional semiconductor device.

DETAILED DESCRIPTION

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

FIRST EMBODIMENT

Figure 1:
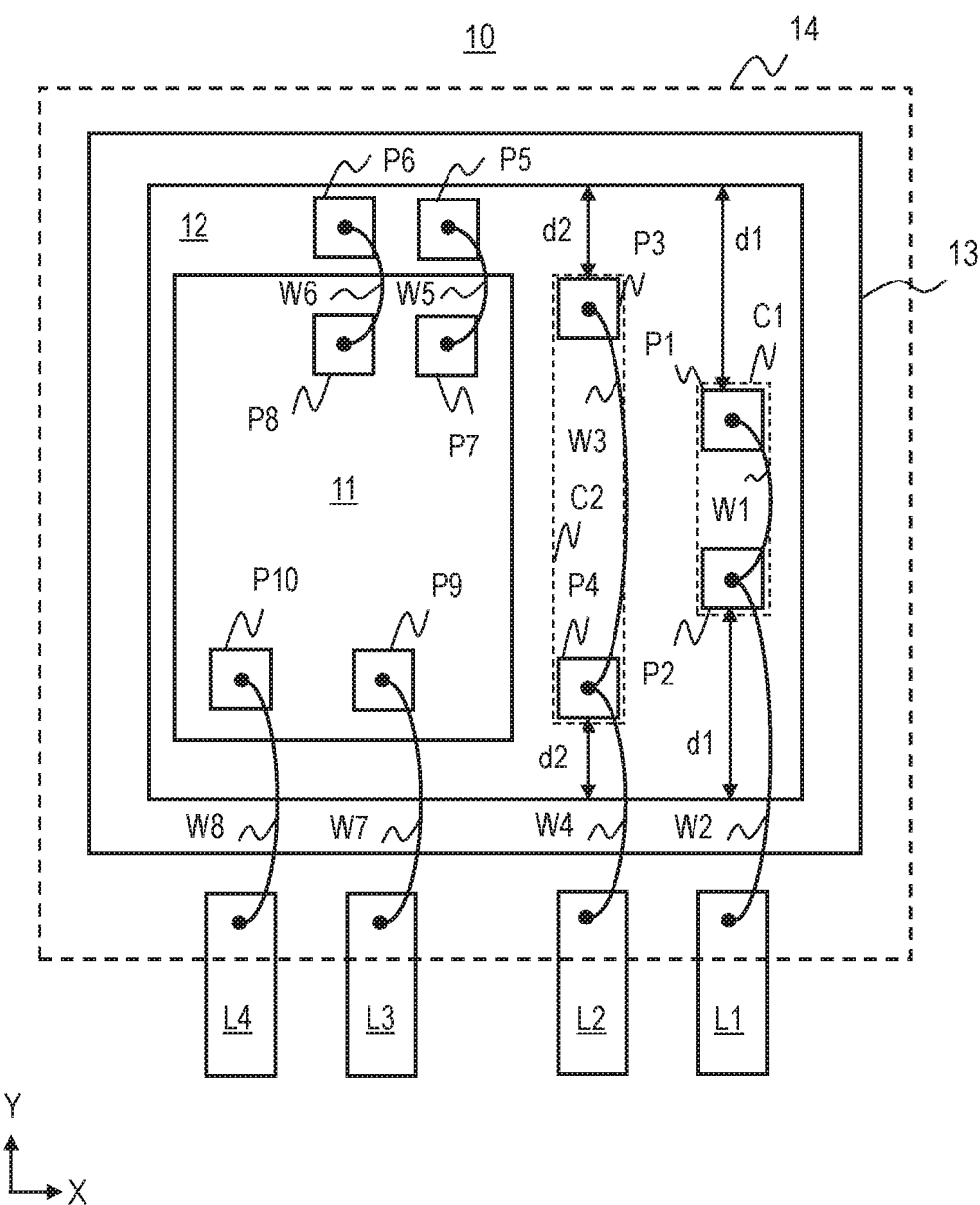
FIG. 1 is a plan view of a semiconductor device according to first embodiment.

FIG. 1 is a plan view of an IPD 10 according to first embodiment. For ease of understanding, FIG. 1 is a transparent view of the encapsulant 14. As shown in FIG. 1, IPD 10 has a control chip 11, a power MOS chip 12. The control chip 11 is mounted on top of the power MOS chip 12.

Power MOS chip 12 is a vertical power MOSFET (or IGBT) there is a source electrode on the front surface and a drain electrode on the back surface. Bonding pads P1-P6 are installed on the surface of the power MOS chip 12. Bonding pads P1-P5 are source pads. Bonding pad P6 is a gate pad. Bonding pads P1 and P2 are connected to the lead (terminal) L1 by bonding wires W1 and W2. Bonding pads P3 and P4 are connected to the lead L2 by bonding wires W3 and W4. The drain electrode on the back surface of the power chip 12 is connected to the lead frame 13.

The control chip 11 has bonding pads P7-P10. The bonding pad P7 is connected to the bonding pad P5 by a bonding wire W5. The bonding pad P8 is connected to the bonding pad P6 by a bonding wire W6. The bonding pad P9 is connected to the lead L3 by a bonding wire W7. The bonding pad P10 is connected to the lead L4 by a bonding wire W8.

Figure 2:
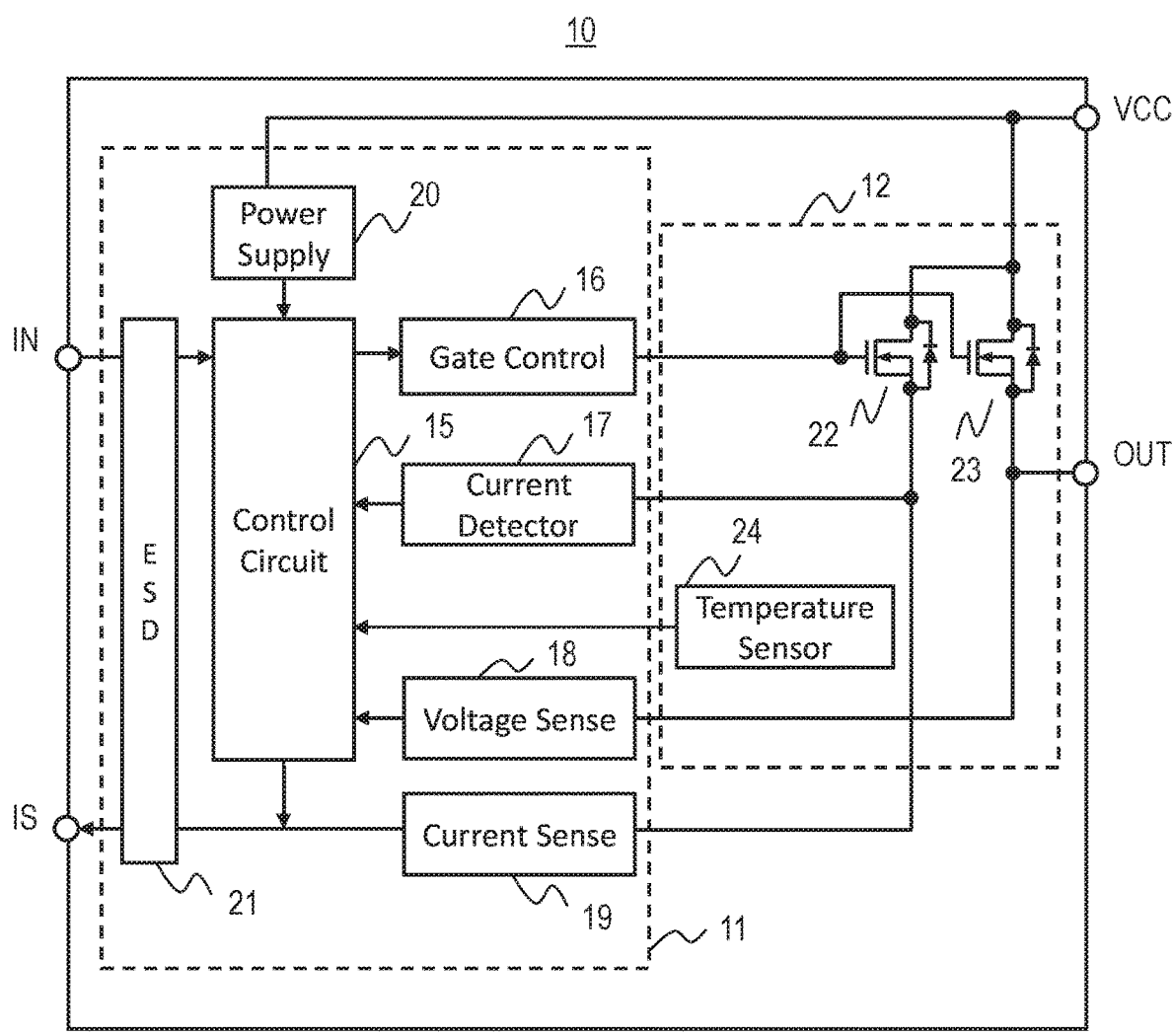
FIG. 2 is a schematic diagram of the semiconductor device according to first embodiment.

FIG. 2 is a schematic diagram of the IPD 10. The power MOS chip 12 has a power MOSFET 23, a sense MOSFET 22, and a temperature sensor 24. Sense MOSFET 22 is a device for detecting the current flowing through the power MOSFET 23. Since these elements are generally used, detailed description thereof will be omitted.

The control chip 11 includes a control circuit 15, a gate control circuit 16, a current detector 17, a voltage sense circuit 18, a current sense circuit 19, a power supply circuit 20 and an ESD protection circuit 21. The control circuit 15 and the gate control circuit 16, in response to an input signal from the outside (IN), generates a gate signal of the power MOSFET 23 and the sense MOSFET 22. Current detector 17 detects the current 2 flowing through the source of the sense MOSFET 22. Voltage sense circuit 18 detects the source voltage of the power MOSFET 23 (output voltage) Control circuit 15, with reference to the output results of the current detector 17, the voltage sense circuit 18 and temperature sensor 24, generates the gate signal. Current sense circuit 19 detects the current flowing through the sense MOSFET 22, and outputs the detection result from the output terminal IS.

Returning to FIG. 1, description will be made again. Bonding pad P8 is coupled to the output of the gate control circuit 16. The gate pad P6 is coupled to the gate of the power MOSFET 23 and sense MOSFET 22. Bonding pad P7 is coupled to the input of the current detector 17. Bonding pad P5 is coupled to the source of the sense MOSFET 22. The bonding pad P10 is coupled to an input of the control circuit 15. Bonding pad P9 is connected to the output of the current sense circuit 19. In FIG. 1, a part of the connection between the control chip 11 and the power MOS chip 12 is omitted for simplifying.

Next, the bonding pads P1 to P4, which are characteristics of the first embodiment, will be described. As shown in FIG. 1, bonding pads P1 to P4 are formed in the region where the control chip 11 is not mounted in the power MOS chip 12, When counted from the outer edge of the power MOS chip 12 along the Y-axis to the control chip 11 side, the bonding pads P1 and P2 are called as a first column bonding pad (C1), the bonding pads P3 and P4 are called as a second column bonding pad (C2). Compared to the second column bonding pad, the first column bonding pad is formed inward from the outer edge of the power MOS chip 12 along the X-axis. That is, a distance d1 from the outer edge of the power MOS chip 12 along the X-axis to the first column bonding pad is longer than a distance d2 from the outer edge of the power MOS chip 12 along the X-axis to the second column bonding pad.

Compared to the bonding pads P1 and P2, a contribution of the bonding pads P3 and P4 to the current flowing in the power MOSFET formed beneath the control chip 11 is inevitably increased. In other words, it can be said that the bonding pads P3 and P4 have charge of a large area of the source electrode. Further, it can be said that the bonding pads P1 and P2 have charge of small area of the source electrode. This caused variations in the current flowing in the power MOSFET. In the first embodiment, by forming the bonding pads P1 and P2 at a position away from the corner of the power MOS chip 12 than the prior art, and a position away from the bonding pads P3 and P4, the area of the source electrode that the bonding pads P1 and P2 have charge of is increased. By the area of the source electrode which the bonding pads P1 and P2 have charge of is widened, the area of the source electrode which bonding pads P3 and P4 have charge of is narrowed. Therefore, compared to the prior art, it is possible to suppress variations in the current flowing through the power MOSFET.

Figure 3:
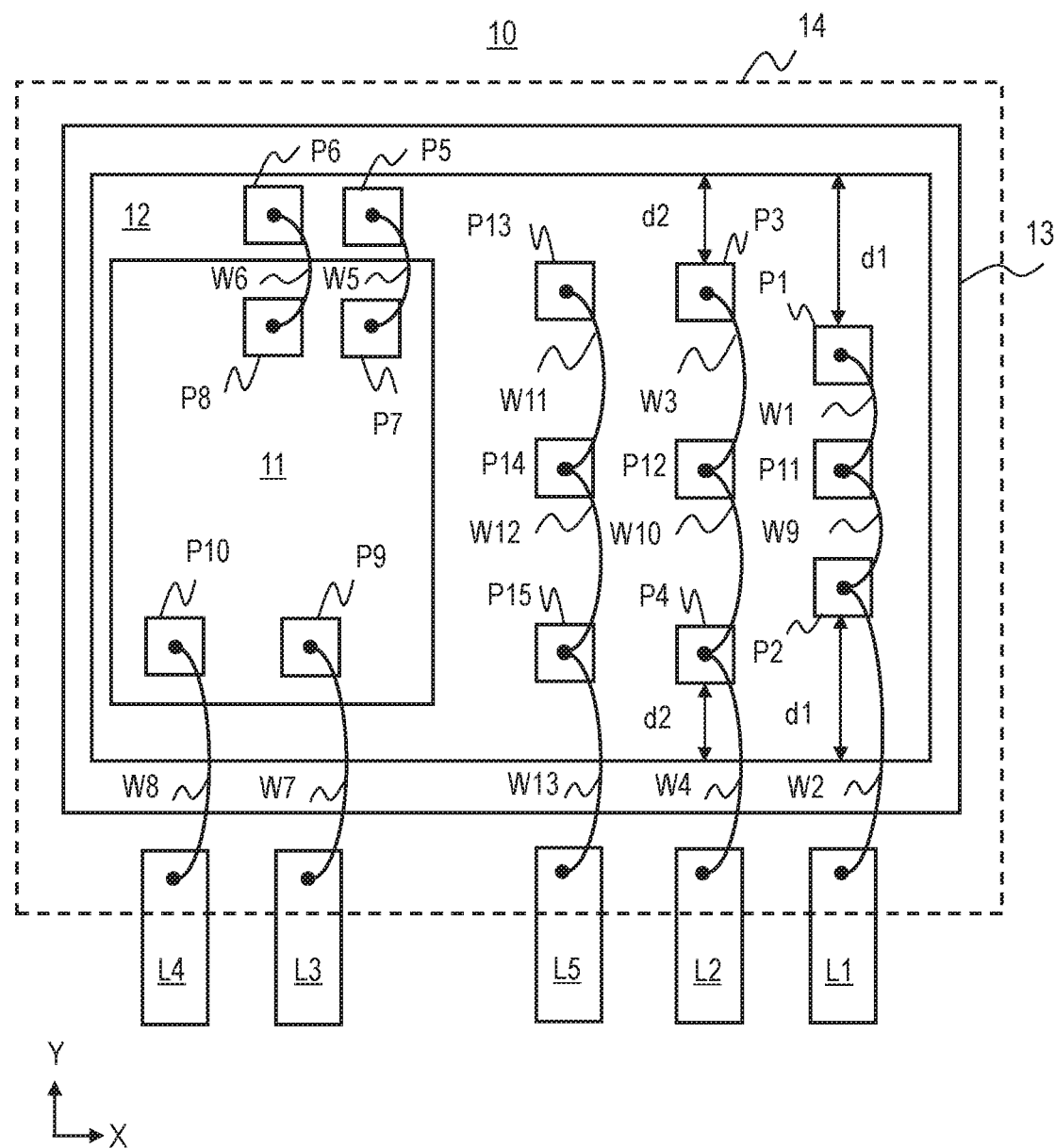
FIG. 3 is a plan view of semiconductor device according to first embodiment.

In FIG. 1, the bonding pads P1 to P4 are formed in two columns, and the number of bonding pads per column is two. However, it is not limited to this. The bonding pads may be arranged in three or more columns, and the number of bonding pads per column may be three or more. FIG. 3 shows plan view for three columns of bonding pads and three bonding pads per column. In FIG. 3, the bonding pads (source pads) P11 to P15, the bonding wires W9 to W13, and the lead L5 are added as compared with FIG. 1. The first column bonding pad is formed inside the second column bonding pad, as the same as in FIG. 1. By increasing the number of bonding pads, it is possible to further suppress the variation of the current flowing through the power MOSFET.

As described above, in IPD 10 of first embodiment, the first column bonding pad is formed more inward than the second column bonding pad. Thus, it is possible to suppress variations in the current flowing through the power MOSFET.

SECOND EMBODIMENT

Figure 4:
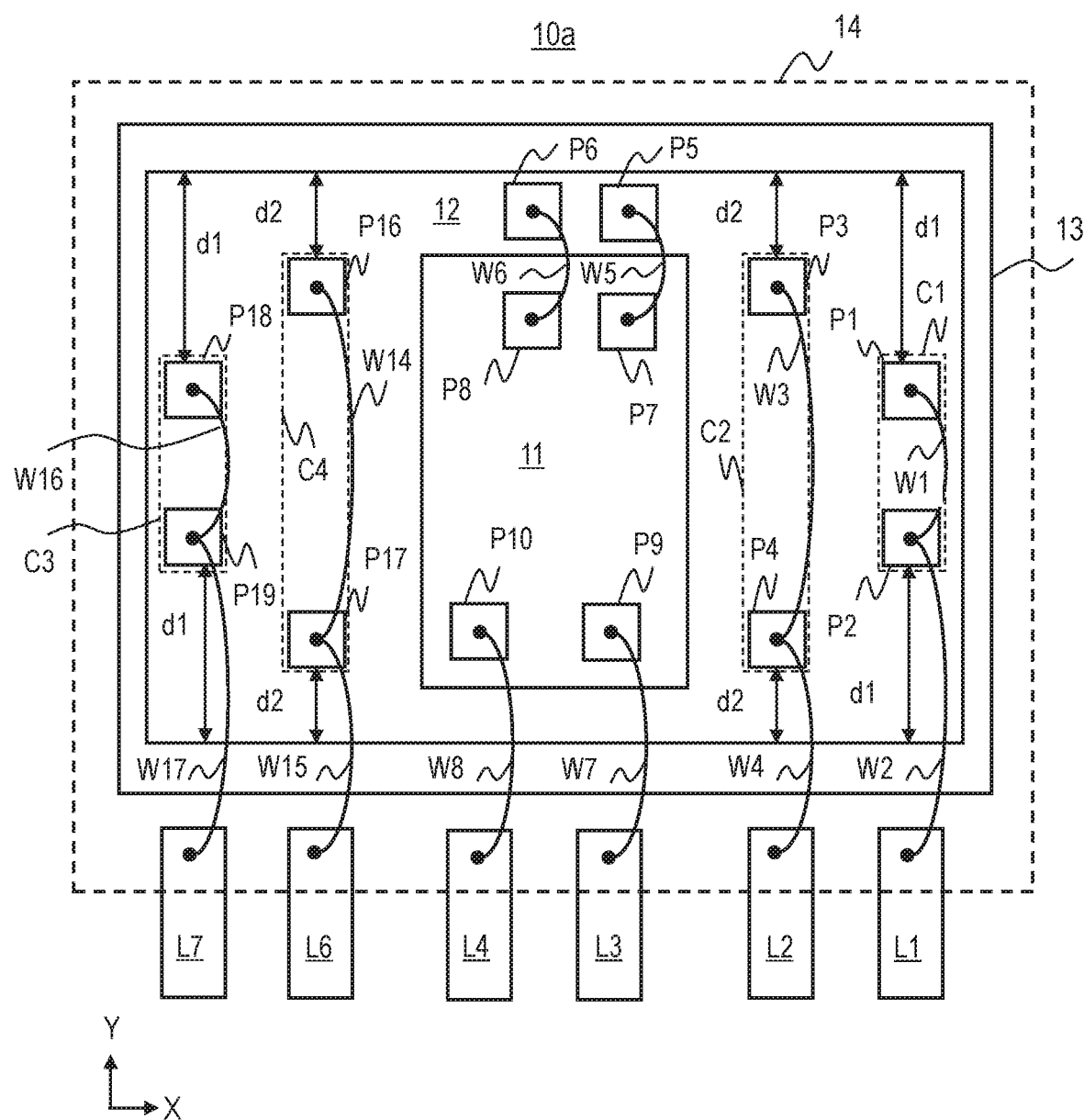
FIG. 4 is a plan view of semiconductor device according to second embodiment.

FIG. 4 is a plan view of an IPD 10a according to second embodiment. The difference from first embodiment is that the control chip 11 is mounted near the central of the power MOS chip 12. More precisely, the control chip 11 is mounted on the X axis near the central of the power MOS chip 12.

In FIG. 4, as compared with FIG. 1, bonding pads (source pads) P16 to P19, bonding wires W14 to W17, and leads L6 and L7 are added. Bonding pads P16 and P17 are connected to lead L6 by bonding wires W14 and W15. Bonding pads P18 and P19 are connected to lead L7 by bonding wires W16 and W17.

Bonding pads P1-P4 are formed in the power MOS chip 12 in a first region where the control chip 11 is not mounted. Bonding pads P16-P19 are formed in the power MOS chip 12 in a second region where the control chip 11 is not mounted. The first region is the region between the first outer edge of the power MOS chip 12 along the Y-axis and the control chip 11. The second region is the region between the second outer edge of the power MOS chip 12 along the Y-axis and the control chip 11.

Similar to first embodiment, when counted from the first outer edge of the power MOS chip 12 along the Y-axis to the control chip 11 side, the bonding pads P1 and P2 are the first column bonding pad, the bonding pads 23 and 24 are the second column bonding pad. Similarly, when counting from the second outer edge of the power MOS chip 12 along the Y-axis to the control chip 11 side, the bonding pads P18 and P19 are a first column (a third column in total) bonding pad (C3), and the bonding pads P16 and P17 are a second column (a fourth column in total) bonding pad (C4). The third column bonding pad is formed in the same manner as the first column bonding pad, and the fourth column bonding pad is formed in the same manner as the second column bonding pad. That is, compared to the fourth column bonding pad, the third column bonding pad is formed inward from the outer edge of the power MOS chip 12 along the X-axis. In other words, the third and fourth column bonding pads and the first and second column bonding pads are formed in line symmetry with respect to the mounting point of the control chip 11.

When the control chip 11 is mounted near the center of the power MOS chip 12, the second embodiment can suppress variations in the current flowing in the power MOSFET.

As described above, in IPD 10a of second embodiment, the same effects as those of first embodiment can be obtained.

THIRD EMBODIMENT

Figure 5:
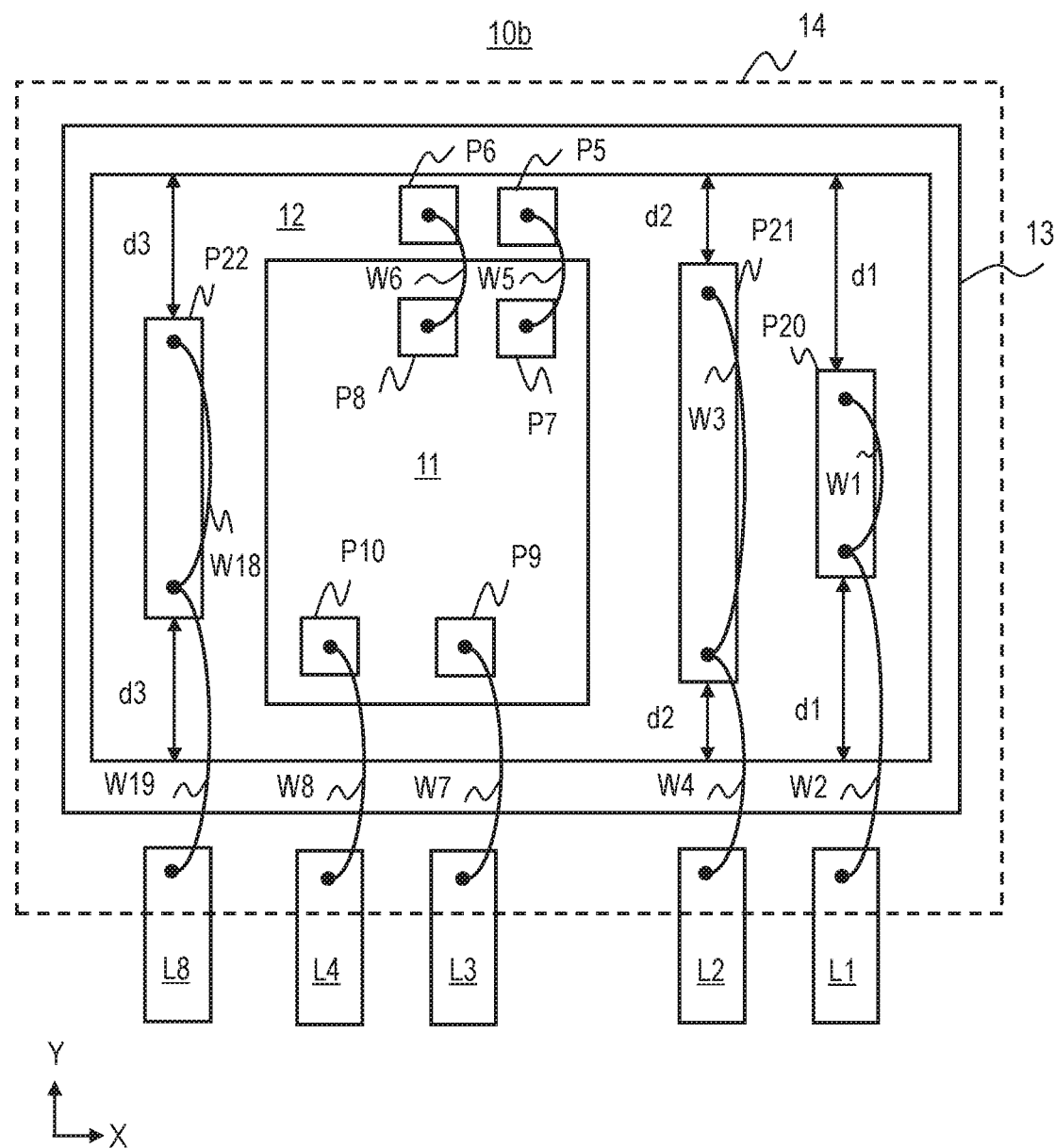
FIG. 5 is a plan view of semiconductor device according to third embodiment.

FIG. 5 is a plan view of an IPD 10b according to third embodiment. Like second embodiment, bonding pads are also formed on the left side of the control chip 11.

In FIG. 5, a first column (a third column in total) bonding pad (source pad) P22, the bonding wires W18 to W19, and the lead L8 are added to the second region. In first embodiment, the first column bonding pad (C1) is composed of two bonding pads P1 and P2, the second column bonding pad (C2) is composed of two bonding pads P3 and P4. In FIG. 5, the first column bonding pads is composed of one rectangular bonding pad P20, and the second column bonding pad is composed of one rectangular bonding pad P21. Then, the third column bonding pad P22 is connected to the lead L8 by bonding wires W18 and W19.

Similar to first embodiment, the first column bonding pad P20 is formed at a distance d1 from the outer edge of the power MOS chip 12 along the X-axis, the second column bonding pad P21 is formed at a distance d2 from the outer edge (d1>d2). The third column bonding pad P22 is formed at a distance d3 from the outer edge. Where d1>d3>d2.

By forming the third column bonding pad P22 at a position away from the corners (upper left corner, lower left corner) of the power MOS chip 12, for the same reason as the first column bonding pad, it is possible to increase the area of the source electrode which the bonding pad P22 has charge of. However, the first and second column bonding pads are formed on the right side of the control chip 11, but only the bonding pad P22 is formed on the left side of the control chip 11. That is, although both the first and second column bonding pads can contribute to the source electrode near the upper right corner and the lower right corner of the power MOS chip 12, only the bonding pad P22 can contribute to the source electrode near the upper left corner and the lower left corner of the power MOS chip 12. Therefore, by setting d1>d3>d2, the area of the source electrode which the bonding pad P22 has charge of is increased, and the degree of contribution to the source electrode near the corner is increased.

As described above, IPD 10b of the third embodiment can obtain the effects of first embodiment or more.

FOURTH EMBODIMENT

Figure 6:
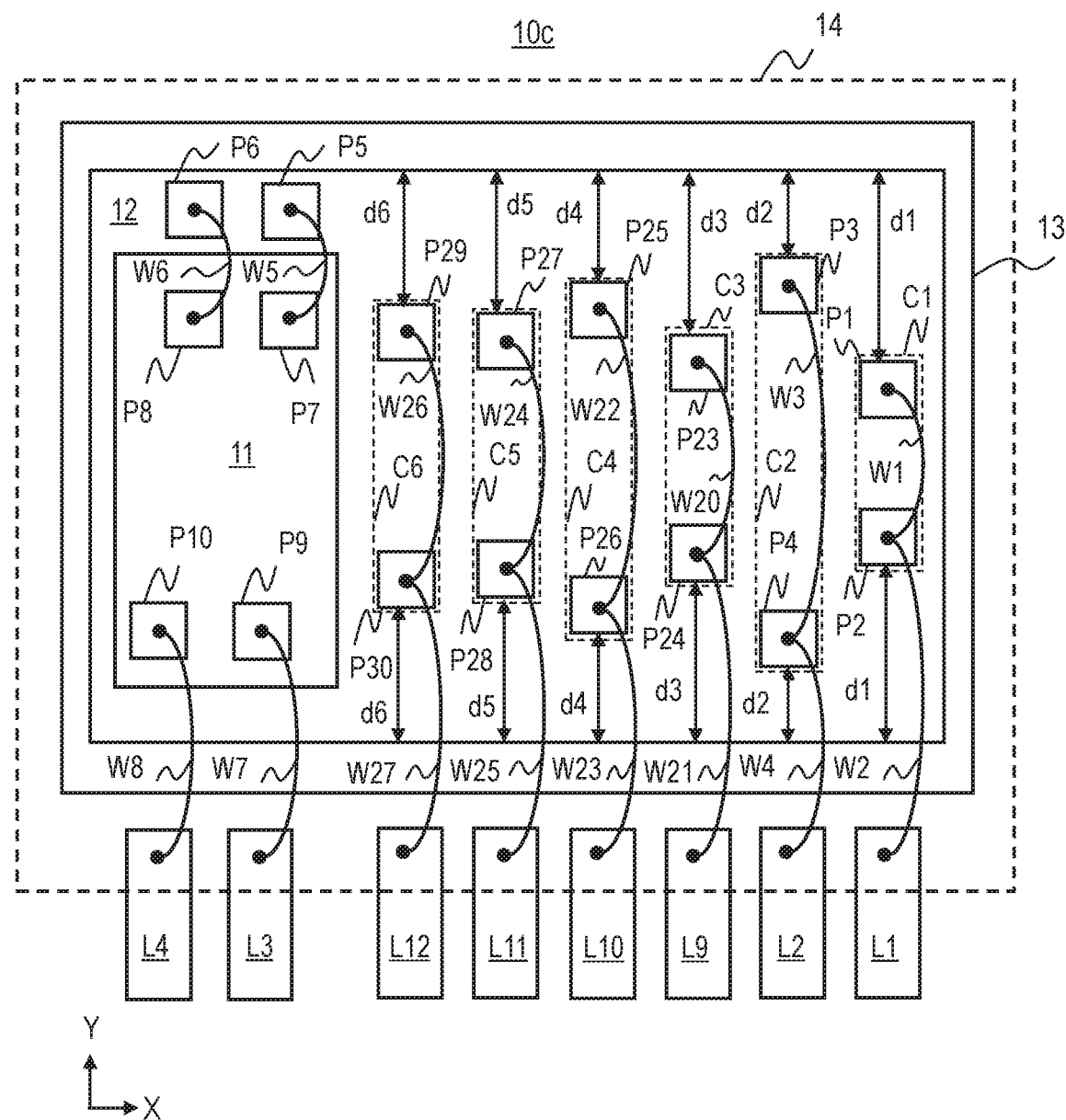
FIG. 6 is a plan view of semiconductor device according to fourth embodiment.
Figure 7:
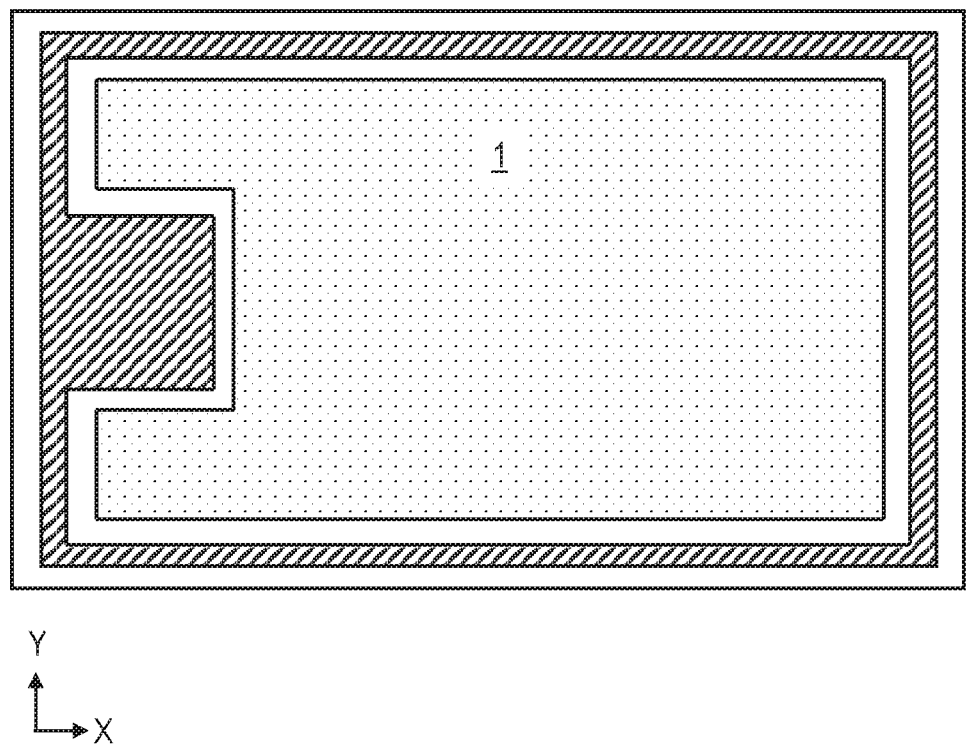

FIG. 6 is a plan view of an IPD 10c according to fourth embodiment. The difference from first embodiment is that six column bonding pads C1 to C6 are formed on the right side of the control chip 11.

The first and second column bonding pads (C1, C2) are the same as those in first embodiment. The third column bonding pad C3 is composed of bonding pads P23 and P24. The fourth column bonding pad C4 is composed of bonding pads P25 and P26. The fifth column bonding pad C5 is composed of bonding pads P27 and P28. The sixth column bonding pads C6 is composed of bonding pads P29 and P30.

The third column bonding pad C3 is connected to the lead L9 by bonding wires W20 and W21. The fourth column bonding pad C4 is connected to the lead L10 by bonding wires W22 and W23. The fifth column bonding pad C5 is connected to the lead L11 by bonding wires W24 and W25. The sixth column bonding pad C6 is connected to the lead L12 by the bonding wires W26 and W27.

As shown in FIG. 6, the distances d1, d3, d5 from the outer edge of the power MOS chip 12 along the X-axis to the odd-numbered column bonding pads C1, C3, C5 are progressively shortened (d1>d3>d5). The distances d2, d4, and d6 from the outer edge of the power MOS chip 12 along the X-axis to the even-numbered column bonding pads C2, C4, and C6 gradually increase (d2<d4<d6). This is because the influence of the corners (upper right corner, lower right corner) of the power MOS chip 12 gradually decreases from the outer edge of the power MOS chip 12 along the X-axis to the control chip 11.

In the fourth embodiment, when forming the three or more column bonding pads, it is possible to suppress variations of the current flowing in the power MOSFET.

The bonding pads may be arranged in six or more columns. In addition, the respective column bonding pads (C1 to C6) may be composed of three or more bonding pads, or may be composed of one rectangular bonding pad as in third embodiment.

As described above, IPD 10c of the present fourth embodiment can obtain the effects of first embodiment or more.

It should be noted that the present invention is not limited to the above-mentioned embodiments, and various modifications can be made without departing from the gist thereof.

What is claimed is:

1. A semiconductor device comprising:
   a power MOS chip having a source electrode on a surface; and
   a control chip mounted on a portion of the power MOS chip,
   wherein, viewing from a first outer edge of the power MOS chip extending in a first direction to the control chip, a first column bonding pad and a second column bonding pad are formed in a region of the source electrode where the control chip is not mounted, and
   wherein a distance between a second outer edge of the power MOS chip extending in a second direction and the first column bonding pad is longer than a distance between the second outer edge and the second column bonding pad.

2. The semiconductor device according to claim 1,
   wherein the power MOS chip has a first and second bonding pads,
   wherein the control chip has third and fourth bonding pads,
   wherein the first bonding pad is coupled to the third bonding pad by a first bonding wire, and
   wherein the second bonding pad is coupled to the fourth bonding pad by a second bonding wire.

3. The semiconductor device according to claim 2,
wherein the power MOS chip has a first and second regions of the source electrode where the control chip is not mounted,
wherein the first region is a region between the first outer edge and the control chip,
wherein the second region is a region between a third outer edge of the power MOS chip extending in the first direction and the control chip,
wherein the first and second column bonding pads are formed in the first region, and
wherein a third column bonding pad is further formed in the second region.

4. The semiconductor device according to claim 3,
wherein a fourth column bonding pad is further formed in the second region, and
wherein the first and second column bonding pads and the third and fourth column bonding pads are formed in line symmetry with respect to a mounting point of the control chip.

5. The semiconductor device according to claim 2, wherein each of the first and second column bonding pads is composed of a plurality of bonding pads.

6. The semiconductor device according to claim 3, wherein each of the first to third column bonding pads is formed of a rectangular bonding pad.

7. The semiconductor device according to claim 3, wherein a distance between the second outer edge and the third column bonding pad is shorter than the distance between the second outer edge and the first column bonding pad, and is longer than the distance between the second outer edge and the second column bonding pad.

8. The semiconductor device according to claim 2,
wherein a plurality of column bonding pads is formed in the region of the source electrode where the control chip is not mounted,
wherein, viewing from the first outer edge to the control chip, distances between odd column bonding pads and the second outer edge are gradually decreased, and
wherein, viewing from the first outer edge to the control chip, distances between even column bonding pads and the second outer edge are gradually increased.

9. The semiconductor device according to claim 2, wherein the semiconductor device is an IPD (intelligent Power Device).

* * * * *